United States Patent
Shah et al.

(10) Patent No.: US 12,212,310 B2
(45) Date of Patent: Jan. 28, 2025

(54) GATE BIAS CIRCUIT FOR A DRIVER MONOLITHICALLY INTEGRATED WITH A GAN POWER FET

(71) Applicant: TAGORE TECHNOLOGY, INC., Arlington Heights, IL (US)

(72) Inventors: Manish Shah, Vernon Hills, IL (US); Rajesh Ghosh, Hooghly (IN); Syed Asif Eqbal, Patna (IN); Firdos Khan, Raniganj (IN); Subhendu Rana, Purba Medinipur (IN)

( * ) Notice: Subject to any disclaimer, the term of this patent is extended or adjusted under 35 U.S.C. 154(b) by 136 days.

(21) Appl. No.: 18/045,482

(22) Filed: Oct. 11, 2022

(65) Prior Publication Data
US 2023/0110867 A1    Apr. 13, 2023

Related U.S. Application Data

(60) Provisional application No. 63/254,747, filed on Oct. 12, 2021.

(51) Int. Cl.
*H03K 17/14*    (2006.01)
(52) U.S. Cl.
CPC ... *H03K 17/145* (2013.01); *H03K 2217/0063* (2013.01); *H03K 2217/0072* (2013.01)

(58) Field of Classification Search
CPC ......... H03K 17/145; H03K 2217/0063; H03K 2217/0072; H03M 3/07
See application file for complete search history.

(56) References Cited

U.S. PATENT DOCUMENTS 10,454,472 B2 *  10/2019  Reusch ............ H03K 17/04206
10,965,281 B2 *   3/2021  Nagl ................. H03K 17/08122

* cited by examiner

*Primary Examiner* — Ryan Johnson
*Assistant Examiner* — Colleen J O Toole
(74) *Attorney, Agent, or Firm* — Jon Gibbons; Fleit Intellectual Property Law (57) ABSTRACT

An electronic device includes a GaN power FET, a GaN driver coupled to the GaN power FET and a gate bias circuit coupled to the GaN driver. The GaN power FET and the GaN driver are monolithically integrated on a single GaN die. The gate bias circuit is predominately monolithically integrated on the single GaN die and includes only one active component external to the single GaN die. In one embodiment, the only active component external to the single GaN die is a linear regulator. In another embodiment, the only active component external to the single GaN die is a shunt regulator. In yet another embodiment, the only active component external to the single GaN die is a Zener diode.

11 Claims, 13 Drawing Sheets

GATE BIAS CIRCUIT FOR A DRIVER MONOLITHICALLY INTEGRATED WITH A GAN POWER FET

BACKGROUND

Field

This invention relates generally to active solid-state devices, and more specifically to a driver for a power field-effect transistor fabricated using a gallium nitride semiconductor process.

Related Art

A gallium nitride (hereinafter "GaN") field effect transistor (hereinafter "FET") provides a high switching speed and a low switching loss for a given breakdown voltage and switch size. These characteristics are beneficial in a number of applications ranging from power electronics converters to audio amplifiers to LiDAR. However, the high switching speed is more fully realized only when a GaN FET is made capable of operating at a high speed of operation.

At the present state of the art, commercially available GaN process produces only N-type of devices, and complementary P-types are not available. Therefore, complementary metal oxide semiconductor (hereinafter "CMOS") type of designs, which rely heavily on P-type devices, are not possible for circuits fabricated in a GaN process. Consequently, a lack of complementary devices greatly limits design and performance of circuits in GaN technology.

A GaN transistor, also called a high-electron-mobility transistor (hereinafter "HEMT") can be a depletion-mode device or an enhancement-mode device. Both the depletion-mode device and the enhancement-mode device provide an on path from drain-to-source terminals when the gate-to-source voltage is higher than a certain threshold ($V_T$). The depletion-mode device has a negative $V_T$ and hence is a normally-on device. That is, even when the gate-to-source voltage of a depletion-mode device is 0V, the depletion-mode device is on. The depletion-mode device turns off only when its gate terminal is biased at a negative voltage with respect to its source terminal by a margin larger than $V_T$. On the other hand, the enhancement-mode device has a positive $V_T$, and hence is a normally-off device. That is, the enhancement-mode device is off when its gate-to-source voltage is zero, and the enhancement-mode device turns on only when its gate-to-source voltage goes above the (positive) $V_T$ of the device.

Either a depletion-mode device or an enhancement-mode device may be used as a power switch, but since depletion-mode devices are normally on, they either need a series device in a different process (for example, a silicon process) or they require complicated negative gate drive voltage to turn them off. Therefore, enhancement-mode devices have a clear advantage in terms of gate drive requirement, and are usually the device of choice.

The behavior of GaN devices is different from the behavior of silicon devices. In general, process variations in GaN processes are higher than in silicon semiconductor processes. For example, $V_T$ of a GaN device changes by a much larger amount due to process variations than does $V_T$ of a CMOS device due to process variations. The $V_T$ of a GaN enhancement-mode device may vary from 0.5V to 2.2V depending upon a manufacturing process. However, the $V_T$ of all GaN enhancement-mode devices (of similar type) in a die remains within a reasonable smaller range.

GaN wafers are relatively costly compared to silicon wafers, and, because minimum sizes of GaN devices are still quite large, packaging densities are low. This means that only simple circuits with a limited number of components can be packed within a die in a cost-effective manner.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

GaN is a semiconductor process technology that has a superior figure-of-merit (FoM) compared to silicon process technology. Due to its superior FoM, a GaN-based power converter is typically operated at a much higher switching frequency to extract its full potential of achieving high power density. An electrical current-carrying path between a GaN power FET and its gate driver is the gate drive loop. At higher frequency the gate drive loop needs to be short. Higher switching frequency and fast switching characteristics of a GaN power FET require inductance of the gate drive loop to be very small. This necessitate that most of the gate drive circuit for the GaN power FET be monolithically integrated with the GaN power FET. If a semiconductor power switch and its driver are not on a same die, then parasitic elements, such as die-to-die or die-to-package inductances and capacitances limit the speed of operation. Therefore, if a GaN FET power switch and its GaN driver are made on the same die, i.e., both are fabricated in a GaN process, then potentially higher speed of operation and performance can be achieved.

Compared to a silicon-based power converter, a GaN-based power converter has a much lower limit in terms of a maximum gate voltage that it can tolerate. A conservative approach is to design the driver to operate at lower voltage such that worst-case operating voltage does not exceed the maximum gate voltage. However, the conservative approach is not a desirable approach because operating the GaN power FET at lower gate voltage relinquishes some of the benefit of GaN. The on resistance and the saturation current capability of the GaN power FET significantly suffer when the GaN power FET is operated at lower gate voltage. The above-mentioned constrains demand a low-cost monolithically-integrated GaN-based gate bias circuit for a driver with minimal external components which maintains a constant optimal gate bias voltage within the safe operating limit, and this needs to be done over process corner, temperature, and supply voltage variations.

Disclosed is a predominately GaN-based gate bias circuit for a GaN driver for a GaN power FET that is monolithically integrated with the GaN power FET. The predominately GaN-based gate bias circuit maintains optimal gate voltage over process, temperature and supply voltage variation with a minimum number of external components. In the illustrated embodiments of the predominately GaN-based gate bias circuit shown in FIGS. 1-10, the components within the dotted line area 108 are GaN-based and are all monolithically integrated within a same die.

Figure 1:
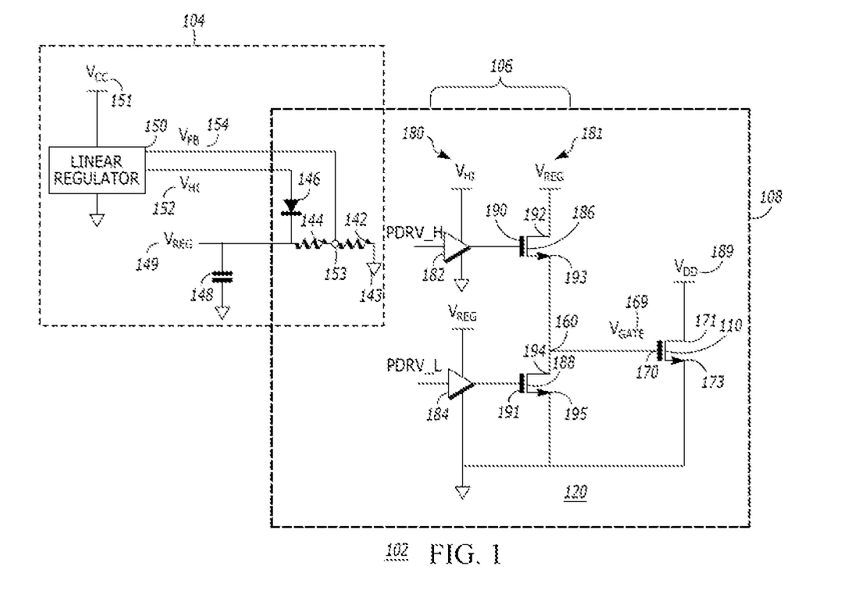
FIG. 1 is a simplified schematic of an electronic device comprising a first embodiment of a gate bias circuit for a GaN driver.

FIG. 1 is a simplified schematic of an electronic device 102 comprising a first embodiment of a gate bias circuit 104 for a GaN driver 106. The GaN driver 106 is monolithically integrated on a single GaN die 108 with a GaN power FET 110. The single GaN die 108 may be disposed in a microelectronic package (not shown). A GaN power switch 120 comprises the GaN driver 106 and the GaN power FET 110.

A first embodiment of the gate bias circuit 104 comprises a first GaN resistor 142 having one end coupled to a ground supply terminal 143 and another end coupled to one end of a second GaN resistor 144. Another end of the second GaN resistor 144 is coupled to a cathode of a GaN diode 146 and to one end of a bypass capacitor 148. The other end of the bypass capacitor 148 is coupled to the ground supply terminal 143. A first input voltage $V_{REG}$ 149 at the other end of the second GaN resistor 144 is coupled to the GaN driver 106. An anode of the GaN diode 146 is coupled to a linear regulator 150. The linear regulator 150 is coupled to a positive power supply terminal 151 that supplies $V_{CC}$ and to the ground power supply terminal 143. The linear regulator 150 outputs a second input voltage $V_{HI}$ 152 to the GaN driver 106. $V_{HI}$ 152 typically has a value of less than 30V. A fraction of $V_{HI}$ 152 occurs at a node 153 between the first GaN resistor 142 and the second GaN resistor 144 based on a resistance ratio of the resistors, and the fraction is fed back to the linear regulator 150 as a $V_{FB}$ 154. The gate bias circuit 104 is composed of GaN devices on the single GaN die 108 except for the linear regulator 150 and the bypass capacitor 148 which are external to the single GaN die 108. In one embodiment, the linear regulator 150 may be fabricated using silicon-based technology. In one embodiment, the linear regulator 150 is a low-dropout regulator.

An output terminal 160 of the GaN driver 106 is coupled to a gate terminal 170 of the GaN power FET 110. A voltage $V_{GATE}$ 169 at the gate terminal 170 of the GaN power FET 110 needs to be maintained at a maximum allowable voltage without exceeding a safe operating limit to extract full potential of GaN technology. The GaN driver 106 is coupled to $V_{HI}$ 152. The GaN driver 106 is also coupled to the ground supply terminal 143. The GaN driver 106 typically receives low-voltage digital or pulse wave modulated signals from a controller (not shown). The GaN driver 106 creates an output signal having the same frequency and duty cycle as the signal from the controller but strong enough to handle capacitance of the GaN power FET 110. The drain terminal 171 of the GaN power FET 110 is coupled to a high-voltage positive power supply terminal 189 that is coupled to a high-voltage supply $V_{DD}$, and a source terminal 173 of the GaN power FET 110 is coupled to the ground supply terminal 143. For example, $V_{DD}$ is between 200V and 600V.

The GaN driver 106 comprises a pre-driver stage 180 and a final stage 181. The pre-driver stage 180 of the GaN driver 106 comprises high-side pre-driver 182 and low-side pre-driver 184. The final stage 181 of the GaN driver 106 comprises a high-side GaN FET 186 and a low-side GaN FET 188. An input terminal of the high-side pre-driver 182 receives a PDRV_H signal from the controller through an intermediate processing stage (not shown). The high-side pre-driver 182 receives $V_{HI}$ 152 generated by the gate bias circuit 104. An output terminal of the high-side pre-driver 182 is coupled to a gate terminal 190 of the high-side GaN FET 186 of the final stage 181. An input terminal of the low-side pre-driver 184 receives a PDRV_L signal from the controller through an intermediate processing stage (not shown). The low-side pre-driver 184 receives $V_{REG}$ 149 generated by the gate bias circuit 104. An output terminal of the low-side pre-driver 184 is coupled to a gate terminal 191 of the low-side GaN FET 188 of the final stage 181.

The voltage $V_{REG}$ 149 from the gate bias circuit 104 is coupled to a drain terminal 192 of the high-side GaN FET 186 of the final stage 181 of the GaN driver 106. A source terminal 193 of the high-side GaN FET 186 constitutes the output terminal 160 of the GaN driver 106. The source terminal 193 of high-side GaN FET 186 is coupled to a drain terminal 194 of the low-side GaN FET 188 and to the gate terminal 170 of the GaN power FET 110. A source terminal 195 of the low-side GaN FET 188 is coupled to the ground supply terminal 143. The GaN power FET 110 can be turned on and off through the GaN driver 106 when $V_{REG}$ 149 is high. Advantageously, the gate bias circuit 104 in accordance with the invention maintains $V_{REG}$ 149 constant over process, temperature and $V_{CC}$ 151.

The GaN driver 106 needs a voltage $V_{HI}$ 152 that is higher than $V_{REG}$ 149 to overdrive the high-side GaN FET 186 of the final stage 181. $V_{HI}$ 152 needs to be at least one threshold voltage $V_T$ higher than $V_{REG}$ 149 to ensure that the high-side GaN FET 186 is in triode region and $V_{GATE}$ 169 is close to $V_{REG}$. The gate bias circuit 104 generates $V_{HI}$ 152 which is one diode drop higher than $V_{REG}$ 149. $V_{HI}$ tracks process and temperature because the GaN diode 146 tracks variation in process and temperature. The GaN diode 146 tracks variation in process and temperature because it is integrated within the single GaN die 108, and in essence consists of a GaN HEMT device connected as a diode. Unlike known circuits, the gate bias circuit 104 in accordance with the invention includes a closed loop comprising an electrical current-carrying path from the linear regulator 150 through GaN diode 146 through GaN-die resistor 144 and back to the linear regulator. With the closed loop in accordance with the invention, $V_{REG}$ 149 is tightly regulated against load and temperature variations. On the other hand, with an open loop, regulation of an output voltage from a gate bias circuit is poor against load and temperature variations.

Figure 2:
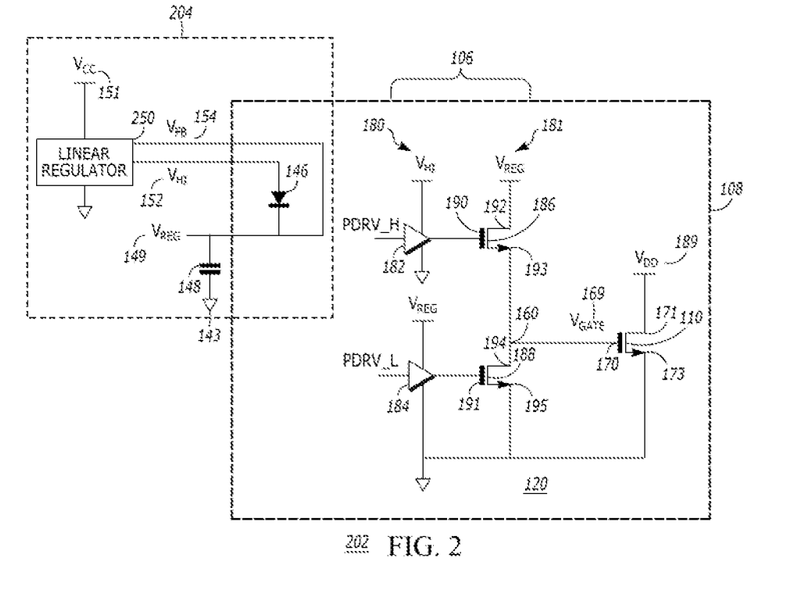
FIG. 2 is a simplified schematic of an electronic device comprising a second embodiment of a gate bias circuit for a GaN driver.

FIG. 2 is a simplified schematic of an electronic device 202 comprising a second embodiment of a gate bias circuit 204 for the GaN driver 106. The second embodiment of the gate bias circuit 304 includes a linear regulator 250 which is the only active component outside the single GaN die 108. In the second embodiment of the gate bias circuit 204 for a GaN driver 106, the feedback voltage $V_{FB}$ 154 is equal to $V_{REG}$ 149 (6V in one example). In the second embodiment, a resistor divider (not shown) is integrated within the linear regulator 250 instead of within the single GaN die 108. All performance characteristics are the same as the first embodiment shown in FIG. 1.

Figure 3:
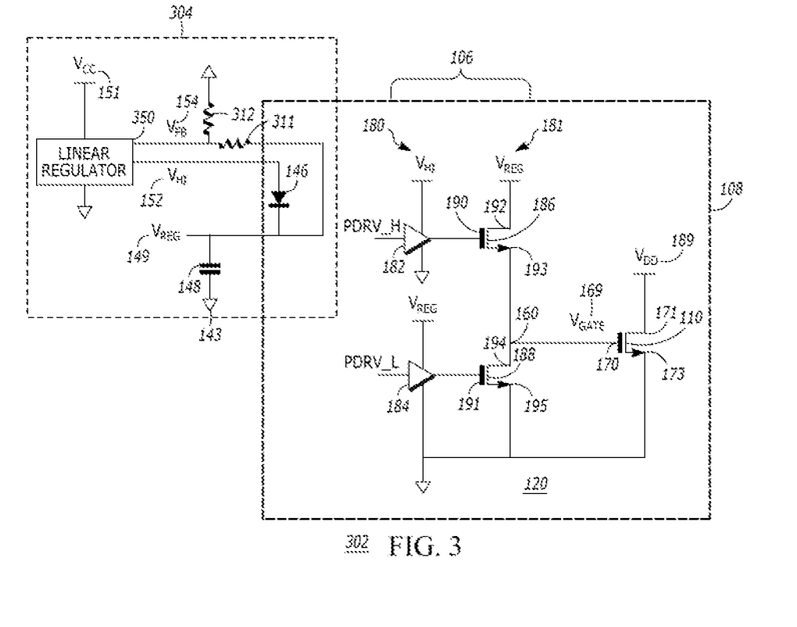
FIG. 3 is a simplified schematic of an electronic device comprising a third embodiment of a gate bias circuit for a GaN driver.

FIG. 3 is a simplified schematic of an electronic device 302 comprising a third embodiment of the gate bias circuit 304 for the GaN driver 106. The third embodiment of the gate bias circuit 304 includes a linear regulator 350 which is the only active component outside the single GaN die 108. With the third embodiment of the gate bias circuit 304, resistor 311 and resistor 312 are kept outside the single GaN die 108 such that $V_{REG}$ 149 can be varied based on requirement of the GaN process technology. The performance of the gate bias circuit 304 is the same as the first embodiment shown in FIG. 1 except that the $V_{REG}$ 149 and $V_{GATE}$ may be set higher or lower by a user, by choosing the ratio of resistor 311 and resistor 312 as per the requirement of the GaN process technology.

Figure 4:
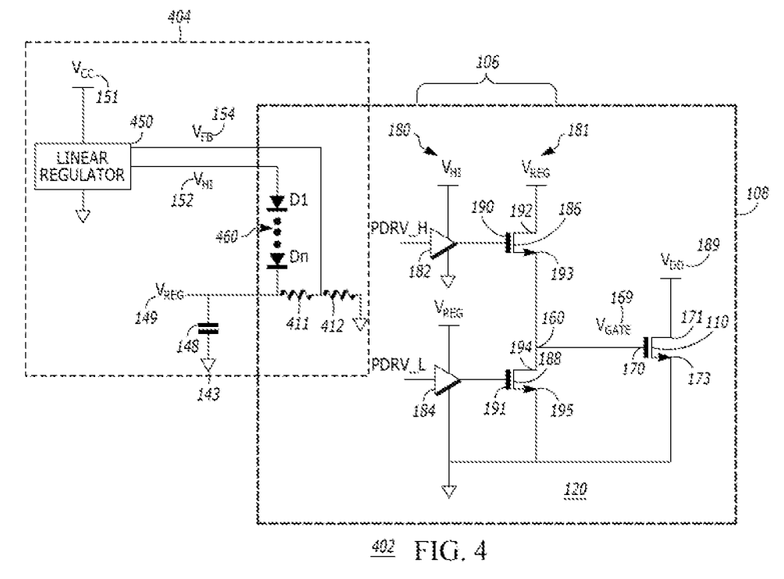
FIG. 4 is a simplified schematic of an electronic device comprising a fourth embodiment of a gate bias circuit for a GaN driver.

FIG. 4 is a simplified schematic of an electronic device 402 comprising a fourth embodiment of the gate bias circuit 404 for a GaN driver 106. The fourth embodiment of the gate bias circuit 304 includes a linear regulator 450 which is the only active component outside the single GaN die 108. The fourth embodiment of the gate bias circuit 304 includes bypass capacitor 148, GaN-die resistor 411 and GaN-die resistor 412. Compared to the first embodiment shown in FIG. 1, in the fourth embodiment there is a series 460 of n GaN diodes $D_1, \ldots, D_n$, and hence $V_{HI}$ 152 is n diodes above $V_{REG}$ 149. This allows a higher overdrive voltage for the high-side GaN FET 186, and hence potentially better performance. The number of diodes in the series 460 is carefully selected based on process technology limitations and characteristics. Specifically, care is exercised so that the gate-to-source voltage of the high-side GaN FET 186 does not exceed a maximum allowed value.

Figure 5:
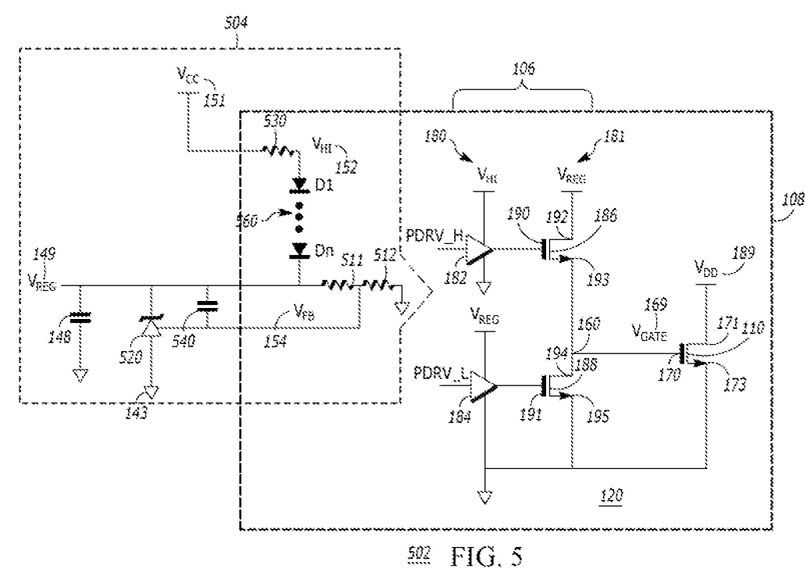
FIG. 5 is a simplified schematic of an electronic device comprising a fifth embodiment of a gate bias circuit for a GaN driver.

FIG. 5 is a simplified schematic of an electronic device 502 comprising a fifth embodiment of a gate bias circuit 504 for the GaN driver 106. Advantageously, in the embodiment shown in FIG. 5 a shunt regulator 520 (also known as a shunt voltage regulator or as a shunt regulator diode) is the only external active component needed. The shunt regulator 520 is shown in FIG. 5 in the form of a Zener diode with a feedback input of $V_{FB}$ 154. In one embodiment, the shunt regulator 520 may be fabricated using silicon-based technology. The shunt regulator 520 regulates a value of $V_{REG}$ 149. Advantageously, $V_{REG}$ 149 is maintained constant over process, temperature and supply voltage. $V_{HI}$ 152 sits above $V_{REG}$ 149 in a similar fashion as with the other illustrated embodiments, but $V_{CC}$-to-$V_{HI}$ feeding is through a resistor R 530. The capacitor 540 is for helping with stability of a shunt regulator 520—resistor 511 loop, and is used if stability needs to be improved. The fifth embodiment includes bypass capacitor 148, and a series 560 of n GaN diodes 560 $D_1, \ldots, D_n$. GaN-die resistor 511 and GaN-die resistor 512 are feedback voltage sense resistors, which provide a voltage at capacitor 540 as the feedback sense signal ($V_{FB}$ 154) to the shunt regulator 520.

Figure 6:
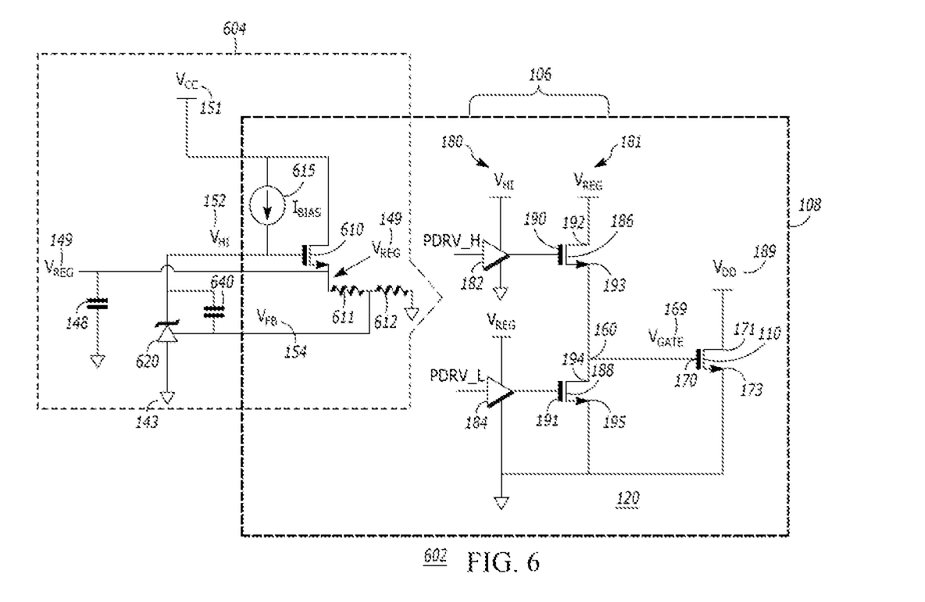
FIG. 6 is a simplified schematic of an electronic device comprising a sixth embodiment of a gate bias circuit for a GaN driver.

FIG. 6 is a simplified schematic of an electronic device 602 comprising a sixth embodiment of a gate bias circuit 604 for the GaN driver 106. The embodiment shown in FIG. 6 is a variation of the embodiment shown in FIG. 5. In the sixth embodiment, a GaN HEMT 610 (internal to the single GaN die 108) acts as a series pass element and produces $V_{REG}$ 149 at its source terminal. A gate of the GaN HEMT 610 is fed from a current source $I_{BIAS}$ 615 drawing current from the positive power supply voltage $V_{CC}$. A voltage at the gate of the GaN HEMT 610 is controlled by a shunt regulator 620 so as to regulate $V_{REG}$ 149 even in the face of process, temperature or supply variations. The voltage at the gate of the GaN HEMT 610 is used as $V_{HI}$ 152, and it is one $V_T$ above $V_{REG}$ 149. The sixth embodiment includes capacitor 640, bypass capacitor 648, GaN-die resistor 611 and GaN-die resistor 612.

Figure 7:
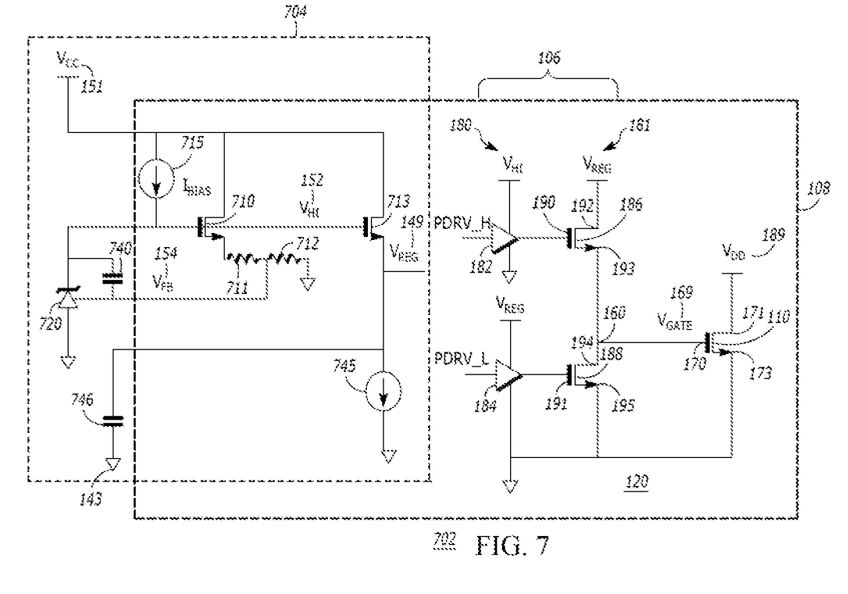
FIG. 7 is a simplified schematic of an electronic device comprising a seventh embodiment of a gate bias circuit for a GaN driver.

FIG. 7 is a simplified schematic of an electronic device 702 comprising a seventh embodiment of a gate bias circuit 704 for the GaN driver 106. The seventh embodiment is a variation of the sixth embodiment shown in FIG. 6. In the seventh embodiment shown in FIG. 7, a shunt regulator loop is de-coupled from $V_{REG}$ With the seventh embodiment, feedback is not directly taken from $V_{REG}$ 149. The seventh embodiment includes GaN HEMT 710, GaN-die resistor 711, GaN-die resistor 712, GaN HEMT 713, current source $I_{BIAS}$ 715, shunt regulator 720, capacitor 740, current source 745 and bypass capacitor 746. The shunt regulator loop comprises an electrical current-carrying path among GaN HEMT 710, GaN resistor 711 and capacitor 740. The shunt regulator loop uses a GaN HEMT 710 to establish the voltage $V_{HI}$ 152 which is always one $V_T$ above the desired value of $V_{REG}$ 149. $V_{HI}$ 152 is used as a gate voltage of the GaN HEMT 713. If load currents of GaN HEMT 710 and GaN HEMT 713 are roughly equal, the source voltage (which is $V_{REG}$ 149) of GaN HEMT 713 will be roughly equal to the source voltage of GaN HEMT 710. Even with a mismatch in currents within a reasonable degree, $V_{REG}$ 149 will be very close to the source of GaN HEMT 710. Therefore, in effect, the shunt regulator achieves the regulation. The seventh embodiment of a gate bias circuit provides some benefits over the embodiment shown in FIG. 6 in terms of loop stability, but regulation of $V_{REG}$ 149 is somewhat degraded.

Figure 8:
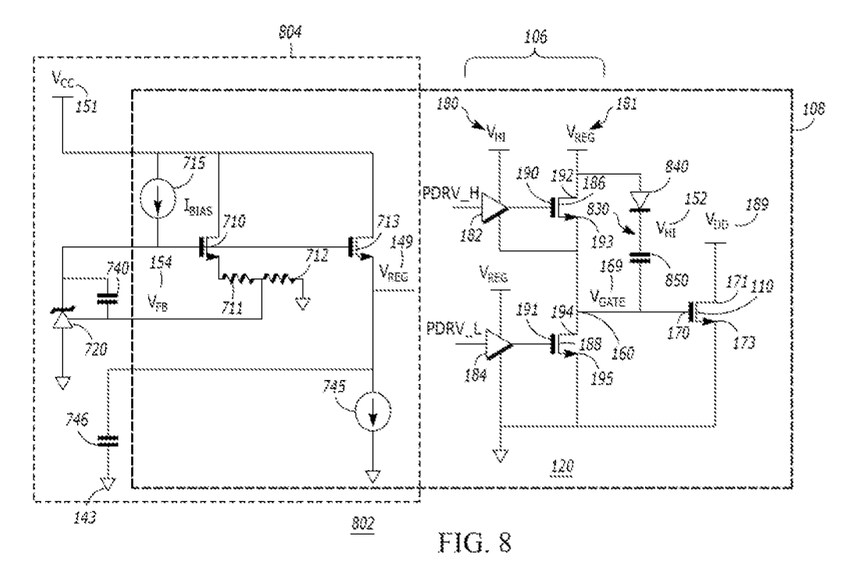
FIG. 8 is a simplified schematic of an electronic device comprising an eighth embodiment of a gate bias circuit for a GaN driver.

FIG. 8 is a simplified schematic of an electronic device 802 comprising an eighth embodiment of a gate bias circuit 804 for the GaN driver 106 with a bootstrap circuit. Here, the generation of $V_{REG}$ 149 is using the same gate bias circuit as in the embodiment of FIG. 7, but $V_{HI}$ 152 is generated using the bootstrap circuit 830. The bootstrap circuit 830 comprises a diode 840 having an anode coupled to the drain terminal 192 of high-side GaN FET 186, and a bootstrap capacitor 850 having one end coupled to a cathode of the diode 840 and another end coupled to the gate terminal 170 of GaN power FET 110. When the low-side GaN FET 188 is on, the bootstrap capacitor 850 gets charged to ($V_{REG}$-$V_D$), i.e., one diode-drop below $V_{REG}$ 149. When the low-side GaN FET 188 turns off and the high-side GaN FET 186 turns on, $V_{HI}$ 152 reaches to ($2V_{REG}$-$V_D$) which is sufficiently high voltage to overdrive the high-side GaN FET 186. The eighth embodiment includes GaN HEMT 710, GaN resistor 711, GaN resistor 712, GaN HEMT 713, current source $I_{BIAS}$ 715, shunt regulator 720, capacitor 740, current source 745 and capacitor 746.

Figure 9:
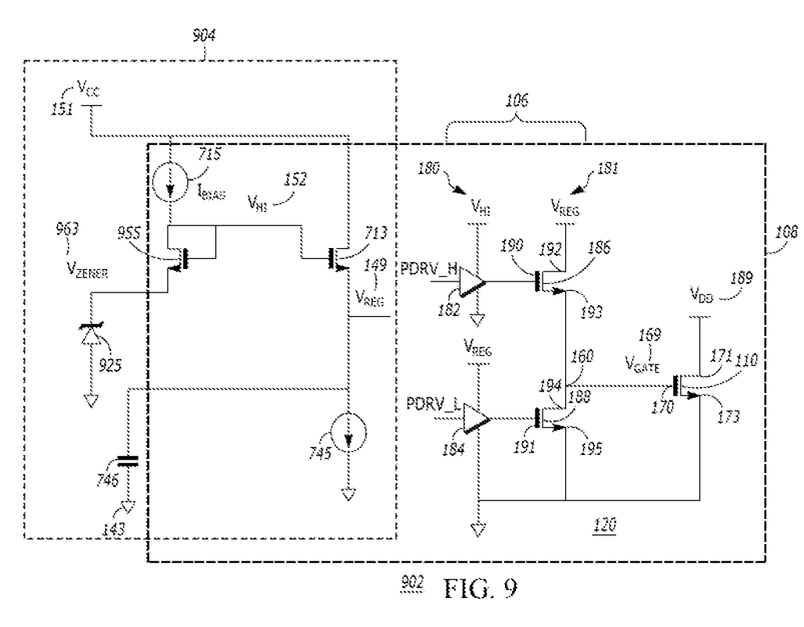
FIG. 9 is a simplified schematic of an electronic device comprising a ninth embodiment of a gate bias circuit for a GaN driver.

FIG. 9 is a simplified schematic of an electronic device 902 comprising a ninth embodiment of a gate bias circuit 904 for the GaN driver 106. The ninth embodiment includes GaN HEMT 713, current source $I_{BIAS}$ 715, current source 745 and capacitor 746. In FIG. 9, instead of a shunt regulator, a Zener diode 925 is used to produce a regulated voltage. The current $I_{BIAS}$ flows through a diode-connected GaN device 955 that establishes a Zener voltage $V_{ZENER}$ 963 which is a regulated voltage. The diode-connected GaN device 955 produces $V_{HI}$ 152 which is one diode-drop (roughly $V_T$) above $V_{ZENER}$ 963. $V_{REG}$ 149 is about $V_T$ below $V_{HI}$ 152, and hence is roughly equal to $V_{ZENER}$ 963. Typically, Zener voltages do not vary much with process, temperature and bias current, and this way, $V_{REG}$ 149 is regulated. Because $V_{HI}$ 152 is one $V_T$ above $V_{REG}$ 149, the high-side GaN FET 186 continues to receive enough overdrive voltage.

Figure 10:
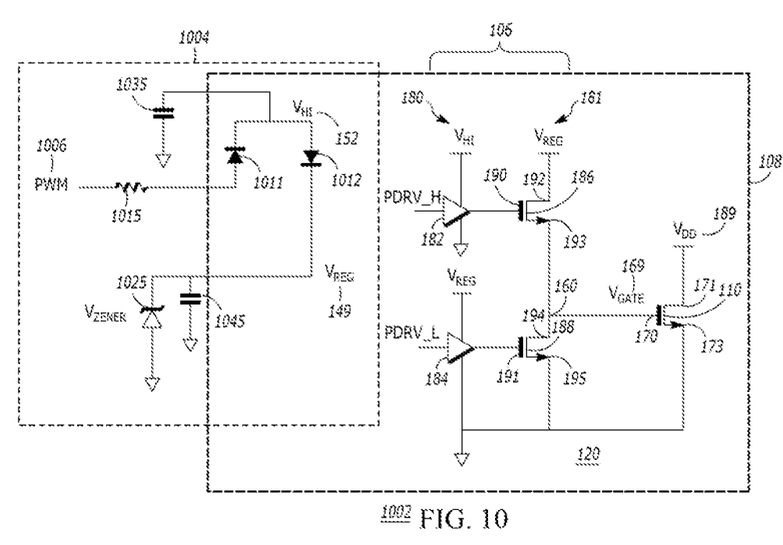
FIG. 10 is a simplified schematic of an electronic device comprising a tenth embodiment of a gate bias circuit for a GaN driver.

FIG. 10 is a simplified schematic of an electronic device 1002 comprising a tenth embodiment of a gate bias circuit 1004 for the GaN driver 106. In FIG. 10, a positive supply voltage is generated using a pulse width modulation (PWM) signal 1006. In one embodiment, the PWM signal 1006 could be the same signal as the input signal to the GaN pre-driver 180. In another embodiment, the PWM signal 1006 and the input signal to the GaN pre-driver 180 are independent of each other. The PWM signal 1006 is rectified using rectifier diode 1011 thereby producing $V_{HI}$ 152. One end of diode 1012 is coupled to rectifier diode 1011. At another end of diode 1012 is $V_{REG}$. $V_{REG}$ 149 is regulated to Zener clamp voltage which can be controlled by selecting a correct Zener voltage. The tenth embodiment includes resistor 1015, Zener diode 1025, capacitor 1035 and capacitor 1045. Advantageously, $V_{HI}$ 152 tracks $V_T$ variation of process because of the monolithically integrated diode 1012. The rectifier diode 1011 can be internal or external to the single GaN die 108.

Figure 11:
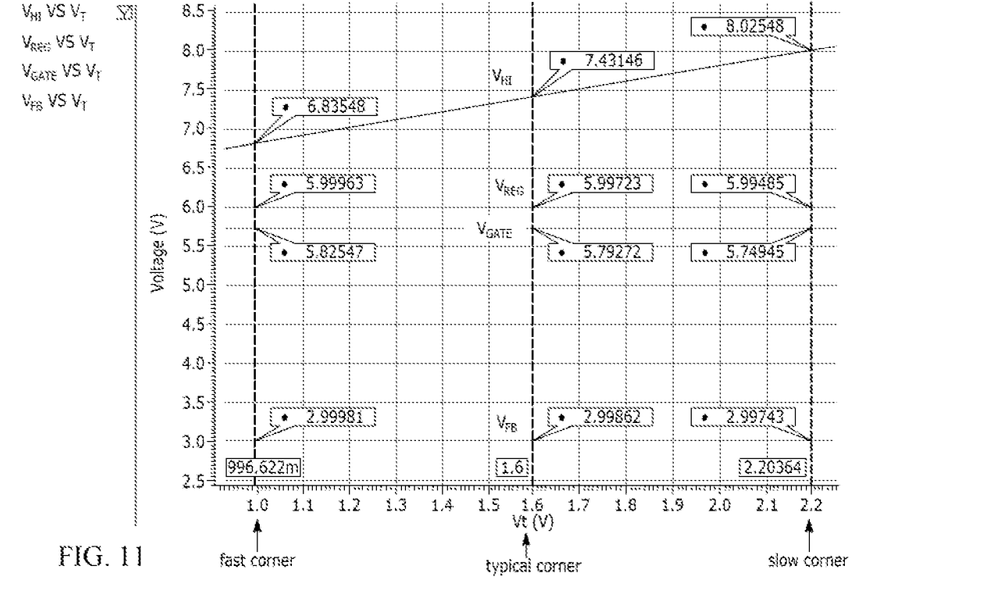
FIG. 11 is a first graph of signals in a simulation of the gate bias circuit in accordance with the invention.

FIG. 11 is a first graph of signals in a simulation of the gate bias circuit in accordance with the invention. FIG. 11 shows the simulation waveform of $V_{GATE}$ 169, $V_{REG}$ 149, $V_{HI}$ 152 and $V_{FB}$ 154 for different $V_T$ process. FIG. 11 illustrates results of a simulation showing $V_T$ sweep from fast process corner (lower $V_T$) to slow corner (higher $V_T$) at +25° C. and 15V of $V_{CC}$. $V_{HI}$ 152 rises in order to maintain $V_{REG}$ 149 at 6V. FIG. 11 illustrates that $V_{REG}$ 149 is maintained at a fixed voltage (6V for the GaN process used) but $V_{HI}$ 152 tracks $V_T$ of the process such that the high-side GaN FET 186 is in the triode region. A goal of the gate bias circuit is for $V_{HI}$ 152 to go higher as $V_T$ goes higher.

Figure 12:
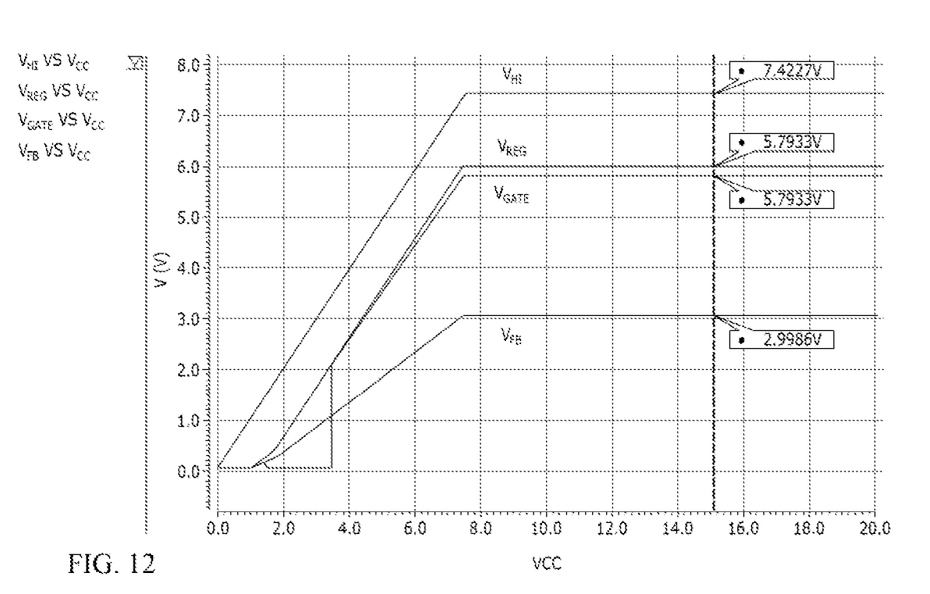
FIG. 12 is a second graph of signals in a simulation of the gate bias circuit in accordance with the invention.

FIG. 12 is a second graph of signals in a simulation of the gate bias circuit in accordance with the invention. The waveform shows $V_{GATE}$ 169, $V_{REG}$ 149, $V_{HI}$ 152 and $V_{FB}$ 154. FIG. 12 illustrates results of a simulation showing a sweep of $V_{CC}$ 151 from 0V to 20V at +25° C., typical process corner. As $V_{CC}$ 151 crosses a minimum required voltage to achieve regulation, $V_{REG}$ 149 gets set at 6V and does not change with further rise in $V_{CC}$. FIG. 12 illustrates that $V_{REG}$ 149 is maintained at 6V when $V_{CC}$ 151 is between 7.5V and 20V.

Figure 13:
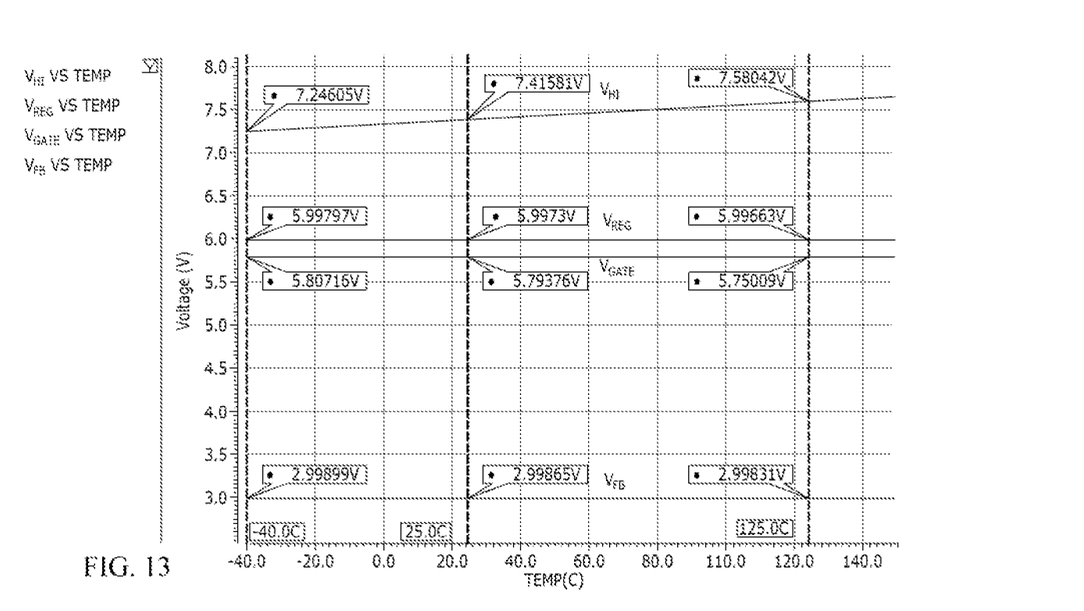
FIG. 13 is a third graph of signals in a simulation of the gate bias circuit in accordance with the invention.

FIG. 13 is a third graph of signals in a simulation of the gate bias circuit in accordance with the invention. FIG. 13 shows the waveform over temperature. FIG. 13 illustrates results of a simulation showing temperature sweep from −40° C. to +150° C. at $V_{CC}$ 15V and process being typical: $V_{HI}$ 152 rises in order to maintain $V_{REG}$ 149 at 6V. As simulation shows, at higher temperature the $V_T$ increases, and hence $V_{HI}$ 152 is increased but $V_{REG}$ 149 is maintained at 6V.

The embodiments of the gate bias circuit in accordance with the invention advantageously insure that $V_{GATE}$ 169 is almost constant regardless of $V_{CC}$ 151, temperature, threshold voltage or process.

All the devices (except for those devices specially identified) of the circuits in accordance with the invention are realized through only GaN HEMTs and by diodes, resistors or capacitors that can be fabricated in available GaN processes. No P-type metal oxide semiconductor device is used in the circuits in accordance with the invention.

Although most of the description herein focuses on GaN HEMT based technology, the topology of the disclosed circuits and their application are independent of the device technology platform, and can be easily extended to silicon or other present or future semiconductor platforms.

Some features of the present invention may be used in an embodiment thereof without use of other features of the present invention. As such, the foregoing description should be considered as merely illustrative of the principles, teachings, examples, and exemplary embodiments of the present invention, and not a limitation thereof.

These embodiments are only examples of the many advantageous uses of the innovative teachings herein. In general, statements made in the specification of the present application do not necessarily limit any of the various claimed inventions. Moreover, some statements may apply to some inventive features but not to others.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as discussed above are used in the fabrication of integrated circuit chips. The resulting integrated circuit chips can be distributed by the fabricator in raw wafer form (that is, as a single wafer that has multiple unpackaged chips), as a bare chip, or in a packaged form. In the latter case, the chip is mounted in a single chip package or in a multichip package. In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products (such as, but not limited to, an information processing system) having a display, a keyboard, or other input device, and a central processor.

Unless stated otherwise, terms such as "first" and "second" are used to arbitrarily distinguish between the elements that such terms describe. Thus, these terms are not necessarily intended to indicate temporal or other prioritization of such elements.

The terms "a" or "an", as used herein, are defined as one as or more than one. The term plurality, as used herein, is defined as two as or more than two. Plural and singular terms are the same unless expressly stated otherwise. The term another, as used herein, is defined as at least a second or more. The terms including and/or having, as used herein, are defined as comprising (i.e., open language). The term coupled, as used herein, is defined as connected, although not necessarily directly, and not necessarily mechanically. The terms program, software application, and the like as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/ dynamic load library and/or other sequence of instructions designed for execution on a computer system.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. An electronic device, comprising:
    a GaN power FET;
    a GaN driver coupled to the GaN power FET; and
    a gate bias circuit including:
        a linear regulator having an output terminal for outputting a $V_{HI}$ voltage to the GaN driver,
        a first GaN resistor having one end coupled to a ground supply terminal and another end coupled to one end of a second GaN resistor, and
        a node, between the first GaN resistor and the second GaN resistor, coupled to an input terminal of the linear regulator,
        wherein another end of the second GaN resistor is coupled to a cathode of a GaN diode and to one end of a bypass capacitor, the other end of the bypass capacitor coupled to the ground supply terminal, wherein an anode of the GaN diode is coupled to the output terminal, and wherein a voltage $V_{REG}$ at the cathode of the GaN diode is coupled to the GaN driver,
    wherein the GaN power FET and the GaN driver are monolithically integrated on a die, and
    wherein the gate bias circuit is predominately monolithically integrated on the die and includes only one active component external to the die.

2. The electronic device of claim 1, wherein a drain terminal of the GaN power FET is coupled to a high-voltage positive power supply terminal, a source terminal of the GaN power FET is coupled to a ground supply terminal, and a gate terminal of the GaN power FET is coupled to the GaN driver.

3. The electronic circuit of claim 1, wherein the GaN driver includes a pre-driver stage coupled to a final stage, and wherein the final stage is coupled to the GaN power FET.

4. The electronic device of claim 3, wherein the pre-driver stage includes a low-side pre-driver that receives the voltage $V_{REG}$ and a high-side pre-driver that receives the voltage $V_{HI}$.

5. The electronic device of claim 3, wherein the final stage includes a low-side GaN FET and a high-side GaN FET.

6. The electronic device of claim 5, wherein the high-side GaN FET has a drain terminal that receives the voltage $V_{REG}$, a gate terminal coupled to an output terminal of the high-side pre-driver, and a source terminal coupled to the gate terminal of the GaN power FET and to a drain terminal of the low-side GaN FET.

7. The electronic device of claim 5, wherein the low-side GaN FET has a gate terminal coupled to an output terminal of the low-side pre-driver and has a source terminal coupled to the ground supply terminal.

8. The electronic device of claim 1, wherein the only one active component is a shunt regulator.

9. The electronic device of claim 1, wherein the only one active component is a Zener diode.

10. The electronic circuit of claim 1, wherein the only one active component external to the die consists of the linear regulator.

11. The electronic circuit of claim 1, wherein a fraction of the $V_{HI}$ voltage occurs at the node between the first GaN resistor and the second GaN resistor based on a resistance ratio of said resistors, and the fraction is fed back to the linear regulator as a voltage $V_{FB}$.

* * * * *